United States Patent
Koelmel et al.

(10) Patent No.: US 9,449,858 B2
(45) Date of Patent: Sep. 20, 2016

(54) TRANSPARENT REFLECTOR PLATE FOR RAPID THERMAL PROCESSING CHAMBER

(75) Inventors: Blake R. Koelmel, Mountain View, CA (US); Aaron M. Hunter, Santa Cruz, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 283 days.

(21) Appl. No.: 13/184,895

(22) Filed: Jul. 18, 2011

(65) Prior Publication Data

US 2012/0070136 A1   Mar. 22, 2012

Related U.S. Application Data

(60) Provisional application No. 61/371,792, filed on Aug. 9, 2010.

(51) Int. Cl.

| H01L 21/67 | (2006.01) |
|---|---|
| F27B 5/14 | (2006.01) |
| F27B 5/18 | (2006.01) |
| F27D 11/02 | (2006.01) |
| F27B 5/06 | (2006.01) |
| F27D 19/00 | (2006.01) |

(52) U.S. Cl.
CPC ........... *H01L 21/67115* (2013.01); *F27B 5/14* (2013.01); *F27B 5/18* (2013.01); *H01L 21/67248* (2013.01); *F27B 5/06* (2013.01); *F27D 11/02* (2013.01); *F27D 2019/0003* (2013.01); *H01L 21/67011* (2013.01)

(58) Field of Classification Search
None
See application file for complete search history.

(56) References Cited

U.S. PATENT DOCUMENTS

| 5,226,732 A * | 7/1993 | Nakos et al. ................. 374/133 |
| 5,820,261 A * | 10/1998 | Yam .................................. 374/2 |
| 5,848,842 A | 12/1998 | Peuse et al. |
| 5,861,609 A * | 1/1999 | Kaltenbrunner et al. ..... 219/390 |
| 6,027,244 A * | 2/2000 | Champetier et al. ......... 374/130 |
| 6,237,529 B1 * | 5/2001 | Spahn ............................ 118/726 |
| 6,483,639 B2 * | 11/2002 | Fujinoki et al. .............. 359/355 |
| 6,780,244 B2 | 8/2004 | Kawase et al. |
| 6,805,466 B1 * | 10/2004 | Ranish .......................... 362/247 |
| 6,839,507 B2 * | 1/2005 | Adams et al. ................. 392/416 |
| 7,041,931 B2 * | 5/2006 | Jennings et al. .............. 219/390 |
| 7,312,422 B2 * | 12/2007 | Wintenberger et al. ...... 219/390 |
| 7,737,385 B2 * | 6/2010 | Timans et al. ................ 219/390 |
| 8,314,368 B2 * | 11/2012 | Ranish et al. ................. 219/405 |

(Continued)

FOREIGN PATENT DOCUMENTS

| JP | 2001/297994 | 10/2001 |
| TW | 428250 | 4/2001 |

(Continued)

OTHER PUBLICATIONS

"International Search Report and Written Opinion in PCT/US2011/046987", mailed on Mar. 23, 2012, 9 pages.

*Primary Examiner* — Joseph M Pelham
(74) *Attorney, Agent, or Firm* — Servilla Whitney LLC

(57) ABSTRACT

The present invention generally relates to methods and apparatus for processing substrates. Embodiments of the invention include apparatuses for processing a substrate comprising a ceramic reflector plate, which may be optically transparent. The reflector plate may include a reflective coating and be part of a reflector plate assembly in which the reflector plate is assembled to a baseplate.

11 Claims, 4 Drawing Sheets

(56) References Cited

U.S. PATENT DOCUMENTS

| | | | | |
|---|---|---|---|---|
| 8,815,331 B2* | 8/2014 | Yamazaki | ............ | C23C 14/564 427/592 |
| 2003/0155072 A1* | 8/2003 | Lee | ........................ | C30B 31/12 156/345.24 |
| 2004/0112885 A1* | 6/2004 | Shigeoka et al. | ............. | 219/388 |
| 2005/0191044 A1* | 9/2005 | Aderhold | ............ | F27B 17/0025 392/418 |
| 2005/0213949 A1* | 9/2005 | Koren et al. | ................... | 392/416 |
| 2006/0127067 A1* | 6/2006 | Wintenberger et al. | ...... | 392/416 |
| 2007/0297775 A1* | 12/2007 | Koren et al. | ................... | 392/416 |
| 2009/0212037 A1* | 8/2009 | Ranish et al. | ................ | 219/405 |
| 2009/0255921 A1* | 10/2009 | Ranish | .............. | H01L 21/67248 219/448.13 |
| 2009/0289053 A1 | 11/2009 | Ranish et al. | | |
| 2009/0298300 A1* | 12/2009 | Ranish et al. | ................ | 438/795 |
| 2009/0323759 A1* | 12/2009 | Govindaraju | ......... | G01J 5/0003 374/123 |
| 2010/0059497 A1 | 3/2010 | Ranish et al. | | |
| 2010/0074604 A1* | 3/2010 | Koelmel | ........... | H01L 21/67098 392/408 |
| 2011/0222840 A1* | 9/2011 | Koren et al. | ................... | 392/411 |
| 2014/0105582 A1* | 4/2014 | Tallavarjula | ......... | H05B 3/0047 392/416 |

FOREIGN PATENT DOCUMENTS

| | | |
|---|---|---|
| TW | 481869 | 4/2002 |
| TW | I283445 | 7/2007 |

\* cited by examiner

TRANSPARENT REFLECTOR PLATE FOR RAPID THERMAL PROCESSING CHAMBER

CROSS REFERENCE

This application claims the benefit of priority of application Ser. No. 61/371,792, filed on Aug. 9, 2010.

BACKGROUND

1. Field of the Invention

The invention relates generally to the field of semiconductor processing. More specifically, the invention pertains to a reflector plate used in a semiconductor thermal processing chamber, such as a rapid thermal processing chamber.

2. Background

Rapid thermal processing (RTP) is a process for annealing substrates during semiconductor fabrication. During this process, thermal radiation is used to rapidly heat a substrate in a controlled environment to a maximum temperature of over nine hundred degrees above room temperature. This maximum temperature is maintained for less than one second to several minutes, depending on the process. The substrate is then cooled to room temperature for further processing. The semiconductor fabrication process has several applications of RTP. Such applications include thermal oxidation (a substrate is heated in oxygen or a combination of oxygen and hydrogen which causes the silicon substrate to oxidize to form silicon dioxide); high temperature soak anneal (different gas mixtures such as nitrogen, ammonia, or oxygen are used); low temperature soak anneal (typically to anneal wafers deposited with metals); and spike anneal (primarily used in processes where the substrate needs to be exposed to high temperatures for a very short time). During a spike anneal, the substrate is rapidly heated to a maximum temperature sufficient to activate a dopant and cooled rapidly to end the activation process prior to substantial diffusion of the dopant.

High intensity tungsten or halogen lamps are used as the source of thermal radiation. A reflector plate (as shown in FIG. 2 and described further below) aids in maintaining temperature uniformity as the reflector plate reflects heat radiation emitted from the wafer back toward the wafer.

FIG. 1 shows a side cross-section of an existing reflector plate 27. As shown in FIG. 1, radiation pyrometer light pipes 42 protrude through an opening in the reflector plate 27 so that they have a clear view of the wafer, as best seen in FIG. 2. Existing reflector plates are made from aluminum. The pyrometer light pipes 42 are flush with the aluminum reflector plate 27 face on which there is a reflective coating (not shown) and which faces the wafer. Because the light pipes and reflective coating are exposed to the chamber environment, wafer byproduct material can deposit on both the light pipes and/or the reflective coating, which causes a drift in temperature measurement. This drift can occur quickly and drastically or in small increments over a long period of time. Furthermore, the reflective coating applied to the aluminum reflector plate is complex and difficult to manufacture (costly), has a maximum operating temperature limit of 150° C., and has been prone to peeling under certain process conditions. A quartz plate 60 is placed between the wafer and the reflector plate 27, and the quartz plate 48 rests upon standoffs 64 affixed to the reflector plate 27, leaving a gap 62. The quartz plate 48 helps mitigate some of the problems mentioned above. However, there is still a need to minimize the issues discussed above with respect to existing reflector plates.

SUMMARY

Accordingly, one or more embodiments of the invention are directed to apparatus for processing a substrate having a front side and a back side. The apparatus comprises a process area within a chamber defined on one side by a window adjacent a radiant heat source located outside the process area and a reflector plate disposed opposite the heat source, the reflector plate comprising a body made from ceramic material and a reflective coating on a side of the reflector plate, and a plurality of apertures extending through at least the reflective coating. In one embodiment, the ceramic material comprises an optically transparent ceramic. In one embodiment, the optically transparent material is selected from alumina, silicon carbide, quartz, and sapphire. According to an embodiment, the side of the reflector plate has a first surface closest to the radiant heat source and a second surface furthest from the radiant heat source, the second surface having the coating thereon.

In one or more embodiments, the apertures are spaced to accommodate pyrometer probes. In one or more embodiments, the apertures extend only through the reflective coating. In one or more embodiments, the reflector plate is mounted to a baseplate to provide a reflector plate assembly. In one embodiment, the reflector plate and baseplate are spaced apart by less than about 5 mm. In other embodiments, the reflector plate and baseplate are in direct contact and are not spaced apart. In one or more embodiments, the reflector plate assembly includes standoffs to separate the reflector plate and baseplate in a spaced apart relationship.

In one embodiment, the reflective coating includes a plurality of dielectric layers. In one embodiment, the ceramic material includes a dopant to increase amount of heat absorbed by the reflector plate. In one or more embodiments, the dopant is selected from rare earth materials, OH and combinations thereof. In one or more embodiments, the baseplate includes a plurality of openings aligned with the apertures in the reflector plate.

In a second aspect embodiments of the invention pertain to a reflector plate assembly apparatus for a rapid thermal processing chamber comprising a baseplate having a plurality of openings therethrough to accommodate a pyrometer probe; and a reflector plate comprising a body made from ceramic material and a reflective coating on a side of the reflector plate, and a plurality of apertures extending through at least the reflective coating aligned with the openings through the baseplate, wherein the reflector plate is assembled to the baseplate such that the openings in the baseplate and the apertures in the reflector plate are aligned. In one embodiment, the baseplate includes a plurality of standoffs to maintain the reflector plate and baseplate in a spaced apart relationship. In one embodiment, the side with the coating faces the baseplate. In one or more embodiments, the ceramic material is optically transparent. In one or more embodiments, the ceramic material is selected from alumina, silicon carbide, quartz, and sapphire. In one or more embodiments, the ceramic material includes a dopant to increase amount of heat absorbed by the reflector plate, wherein the dopant is selected from rare earth materials, OH, and combinations thereof.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 2:
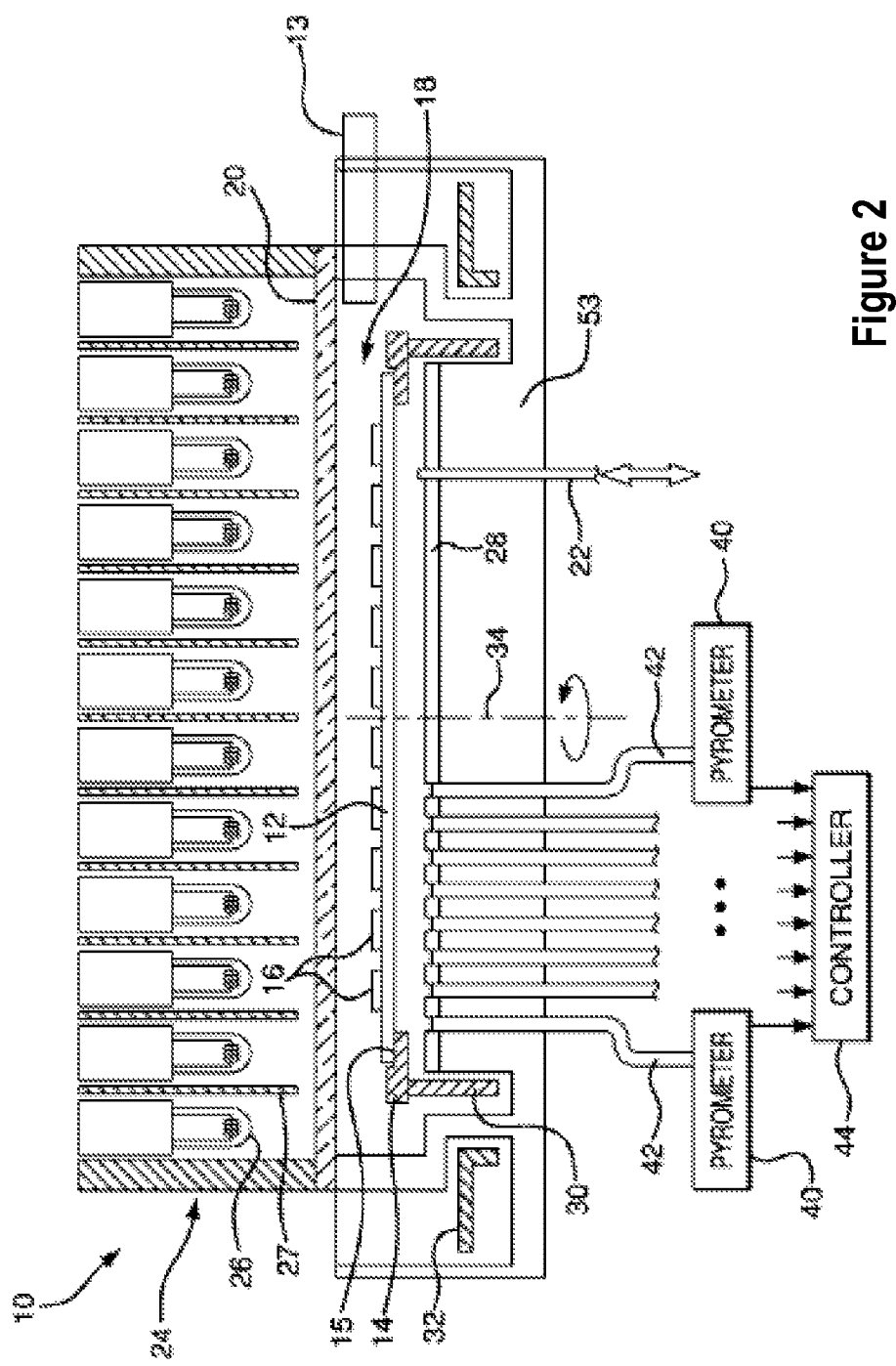
FIG. 2 illustrates a rapid thermal processing chamber.

FIG. 2 schematically represents a rapid thermal processing chamber 10 that can include a reflector plate apparatus in accordance with embodiments of the invention. Peuse et al. describe further details of this type of reactor and its instrumentation in U.S. Pat. Nos. 5,848,842 and 6,179,466. A substrate or wafer 12, for example, a semiconductor wafer such as a silicon wafer to be thermally processed is passed through the valve or access port 13 into the process area 18 of the chamber 10. The wafer 12 is supported on its periphery by a substrate support shown in this embodiment as an annular edge ring 14, which may have an annular sloping shelf 15 contacting the corner of the wafer 12. Ballance et al. more completely describe the edge ring and its support function in U.S. Pat. No. 6,395,363. The wafer is oriented such that processed features 16 already formed in a front surface of the wafer 12 face upwardly, referenced to the downward gravitational field, toward a process area 18 defined on its upper side by a transparent quartz window 20. The transparent quartz window 20 is located a substantial distance from the wafer 12 such that window has minimal effect on cooling of the substrate during processing. Typically, the distance between the wafer 12 and the window 20 is on the order of 20 mm. Contrary to the schematic illustration, the features 16 for the most part do not project substantial distances beyond the surface of the wafer 12 but constitute patterning within and near the plane of the surface. Lift pins 22 may be raised and lowered to support the back side of the wafer 12 when the wafer is handed between a paddle or robot blade (not shown) bringing the wafer into the chamber and onto the edge ring 14. A radiant heating apparatus 24 is positioned above the window 20 to direct radiant energy toward the wafer 12 and thus to heat the wafer. In the reactor or processing chamber 10, the radiant heating apparatus includes a large number, 409 being an exemplary number, of high-intensity tungsten-halogen lamps 26 positioned in respective reflective tubes 27 arranged in a hexagonal close-packed array above the window 20.

It is desirable to control the temperature across the wafer 12 to a closely defined temperature uniform across the wafer 12. In this regard, a reflector plate 28 extending parallel to and over an area greater than the wafer 12 and facing the back side of the wafer 12. The reflector plate 28 efficiently reflects heat radiation emitted from the wafer 12 back toward the wafer 12. The spacing between the wafer 12 and the reflector plate 28 can be within the range of 3 to 9 mm, and the aspect ratio of the width to the thickness of the cavity is advantageously greater than 20. The reflector plate 28, which, as noted above, is made from aluminum and includes a gold coating or multi-layer dielectric interference mirror, effectively forms a black-body cavity at the back of the wafer 12 that tends to distribute heat from warmer portions of the wafer 12 to cooler portions. In other embodiments, for example, as disclosed in U.S. Pat. Nos. 6,839,507 and 7,041,931, the reflector plate 28 may have a more irregular surface or have a black or other colored surface. The reflector plate 28 can be supported on a water-cooled base 53 made of metal to heat sink excess radiation from the wafer, especially during cool down. Accordingly, the process area 18 of the processing chamber has at least two substantially parallel walls, of which a first is a window 20, made of a material being transparent to radiation such as quartz, and a second wall/base 53 substantially parallel to the first wall which is made of metal and is significantly not transparent.

The lamps 26 are divided into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a black-body held at that temperature.

The chamber shown in FIG. 2 allows the wafer 12 support to be easily levitated at different vertical positions inside the chamber to permit control of the substrate's thermal exposure. It will be understood that the configuration shown in FIG. 2 is not intended to be limiting. In particular, the invention is not limited to configurations in which the heat source or lamps are directed at one side or surface of the substrate and the pyrometers are directed at the opposite side of the wafer.

As noted above, wafer temperature in the process area of a processing chamber is commonly measured by radiation pyrometry. While radiation pyrometry can be highly accurate, radiation which is within the radiation pyrometer bandwidth and which originates from the heating source may interfere with the interpretation of the pyrometer signal if this radiation is detected by the pyrometer. In Applied Materials' RTP systems this minimized by the process kit and by the wafer itself. The process kit couples the wafer with the rotation system. It may include a support cylinder which is shown as 30 in FIG. 2. It may also include a support ring which is not shown in the Figures but it may be used in certain processing chamber configurations). Such a support ring is basically an auxiliary edge ring which supports the edge ring, which is shown as 14 in FIG. 2.

The array of lamps 26 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

As used herein, rapid thermal processing or RTP refers an apparatus or a process capable of uniformly heating a wafer at rates of about 50° C./second and higher, for example, at rates of 100° to 150° C./second, and 200° to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rate of up to 100° to 150° C./second, and 200° to 400° C./second distinguishing rapid thermal processing chambers from other types of thermal chambers that do not have a heating system and heating control system capable of rapidly heating at these rates. In accordance with a further aspect of the present invention embodiments of the present invention may be applied also to flash annealing. As used herein flash annealing refers to annealing a sample in less than 5 seconds, specifically, less than 1 second, and in some embodiments, milliseconds.

One way of improving temperature uniformity includes supporting the edge ring 14 on a rotatable cylinder 30 that is magnetically coupled to a rotatable flange 32 positioned outside the chamber. A rotor (not shown) rotates the flange 32 and hence rotates the wafer about its center 34, which is also the centerline of the generally symmetric chamber.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a black-body held at that temperature.

Figure 1:
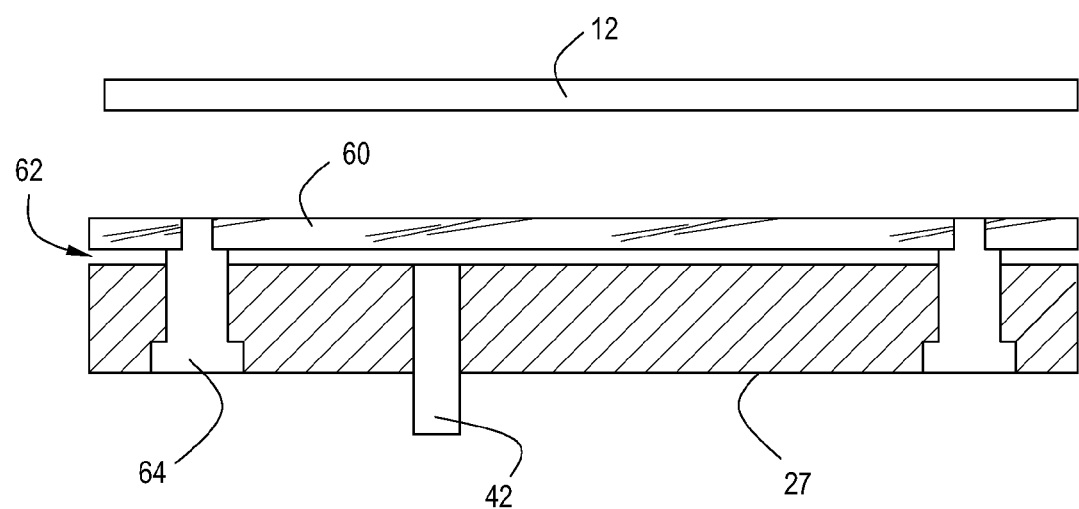
FIG. 1 is a side-cross sectional view of a conventional rapid thermal processing chamber reflector plate assembly.

The chamber shown in FIG. 2 allows the wafer 12 support to be easily levitated at different vertical positions inside the chamber to permit control of the substrate's thermal exposure. It will be understood that the configuration shown in FIG. 1 is not intended to be limiting. In particular, the invention is not limited to configurations in which the heat source or lamps are directed at one side or surface of the substrate and the pyrometers are directed at the opposite side of the wafer.

As noted above, wafer temperature in the process area of a processing chamber is commonly measured by radiation pyrometry. While radiation pyrometry can be highly accurate, radiation which is within the radiation pyrometer bandwidth and which originates from the heating source may interfere with the interpretation of the pyrometer signal if this radiation is detected by the pyrometer. In Applied Materials' RTP systems this minimized by the process kit and by the wafer itself. The process kit couples the wafer with the rotation system. It may include a support cylinder which is shown as 30 in FIG. 1. It may also include a support ring which is not shown in the Figures but it may be used in certain processing chamber configurations). Such a support ring is basically an auxiliary edge ring which supports the edge ring, which is shown as 14 in FIG. 2.

Figure 3:
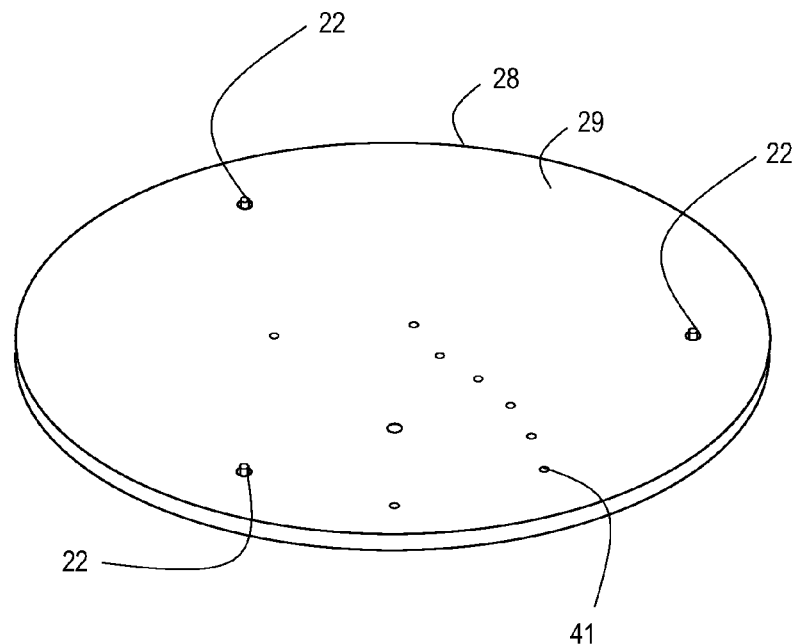
FIG. 3 is perspective view of a reflector plate according to an embodiment of the invention.

According to a first aspect of the invention, an improved reflector plate 28 and reflector plate assembly is provided. FIG. 3 shows a perspective view of a reflector plate 28 of the type used in the apparatus shown in FIG. 2, including openings to allow lift pins 22 to protrude through the reflector plate 28 top side 29.

In one or more embodiments, the reflector plate 28 body is made from an optically transparent material such as quartz, sapphire or transparent YAG. The reflector plate also includes a plurality of light pipe apertures 31 for accommodating the pyrometer light pipes 42 as shown in FIG. 1.

Figure 4:
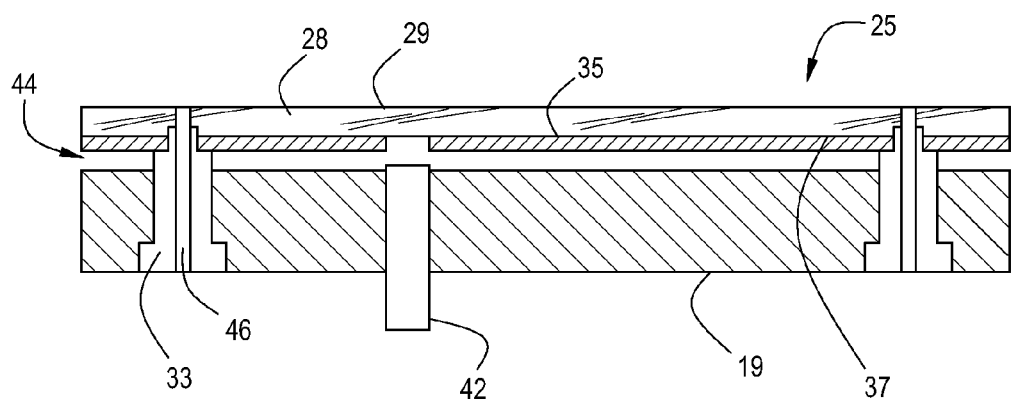
FIG. 4 is a side cross-sectional view of a reflector plate assembly according to an embodiment of the invention.

A reflector plate assembly 25 is shown in FIG. 4 according to an embodiment of the invention. It is noted that the openings to accommodate the lift pins shown in FIG. 3 are not shown in FIG. 4. The reflector plate assembly comprises a baseplate 19, which in one embodiment is made from a suitable metal such as stainless steel. The baseplate 19 can be affixed to the chamber bottom, for example, by bolts, screws or other suitable fasteners to the chamber base 53 shown in FIG. 2. The baseplate 19 has openings through which pyrometer lightpipes 42 can pass through. The openings in the baseplate are aligned with the apertures in the reflector plate to accommodate the pyrometer lightpipes. The reflector plate assembly 25 further comprises a reflector plate 28, the body of which is made from a ceramic, including but not limited alumina, silicon carbide, quartz, sapphire. This ceramic may or may not be optically transparent depending on the selected embodiment. With through-holes allowing the pyrometer light pipes to pass through the ceramic, the coating can be deposited on the first surface and the ceramic does not need to be optically transparent. According to one embodiment, if the coating is deposited on the second surface, then the ceramic should be optically transparent. A first surface reflector will results in a cooler reflector plate, which may or may not be desirable. A second surface reflector will result in a warmer reflector plate, and the coating is also better shielded from any process by products becoming embedded or deposited on top of the coating.

The reflector plate 28 has a diameter similar to the baseplate 19 diameter. The reflector plate 28 is mounted above the baseplate 19. One suitable way of mounting the reflector plate 28 is to place the reflector plate 28 on standoffs 33 such that the reflector plate 28 and the baseplate 19 are spaced apart to provide a gap 44, of less than about 5 mm. In one or more embodiments, the reflector plate 28 and the baseplate 19 are spaced apart by less than about 1 mm, and in other embodiments, there is no spacing between the reflector plate 28 and the baseplate 19. In the configuration shown, the standoffs 33 are positioned and contained by the baseplate but locate and support the reflector plate 28. The reflector plate 28 may further include a reflective coating 35 applied to either side or both sides of the reflector 28. Accordingly, the reflector plate assembly 25 includes a reflector plate 28, which is resting on standoffs 33, which are constrained by the baseplate 19, through which the pyrometer light pipes 42 pass, which are bolted to the chamber bottom 53. In some embodiments, lift pins 46 pass through the standoffs 33. By making the body of the reflector plate 28 of an optically transparent ceramic such as quartz or sapphire the reflective coating can be placed on the backside 37 of the reflector plate (away from the wafer 12). In this orientation, the coated backside 37 is not exposed directly to wafer processing byproducts, and therefore, the coating is less likely to experience peeling. In addition, the pyrometer probes or light pipes 42 which are shown as extending into the coating, but by may flush with the coating 35 are also not directly exposed to the byproducts. As such, the reflector plate, which is optically transparent, will absorb more radiative energy and will get hotter.

Figure 5:
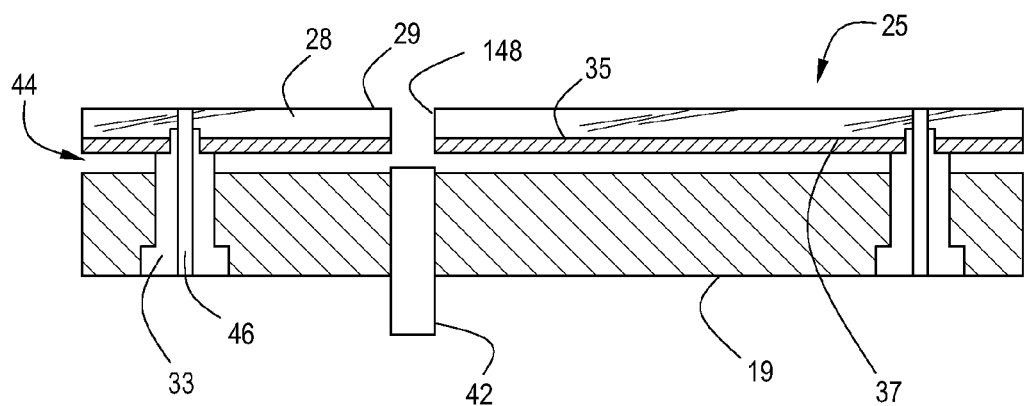
FIG. 5 is a side cross-sectional view of a reflector plate assembly according to an embodiment of the invention.
Figure 6:
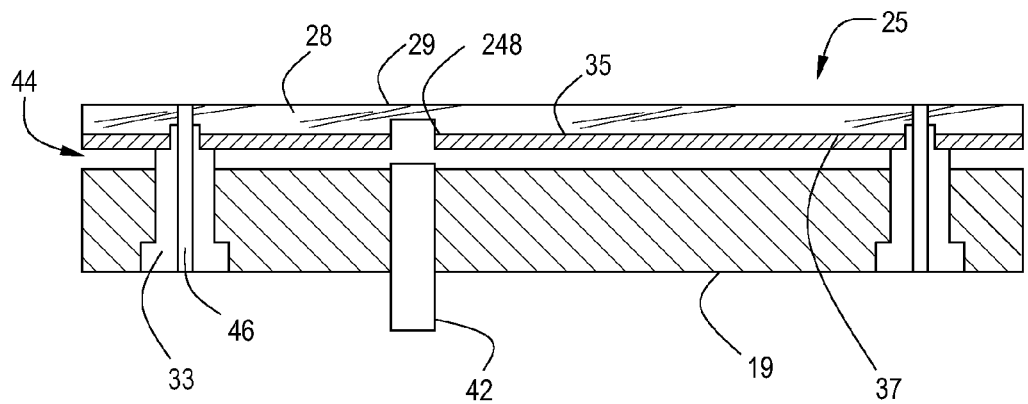
FIG. 6 is a side cross-sectional view of a reflector plate assembly according to an embodiment of the invention.

In the embodiment shown, there are regions on the backside 37 of the reflector plate 28 where no coating is applied, so that the pyrometers still have clear line of sight through the optically transparent reflector plate 28 to the wafer. These uncoated regions may be flush with or within 1 mm of the coated surface. In the embodiment shown, the uncoated regions form blind holes or blind openings. In alternative embodiments, the pyrometer openings may be in the form of apertures 41, or through holes 148 as shown in FIG. 5. In one or more embodiments shown in FIG. 6, blind holes 248 are provided so that the pyrometer light pipes 42 can be designed to be nominally flush with the reflective coating, but allowing for vertical variation due to tolerance stack-ups in the assembly. Furthermore, blind holes offer a convenient way to accurately locate masks that can be used during the coating process to ensure those regions remain uncoated. In one or more embodiments, voids in the coating can be created either by masking before coating deposition or coating removal processes such as laser ablation which selectively removes coating in the areas only where the pyrometers need line of sight into the processing environment. In one or more embodiments, coating can be applied to the top side 29 or first surface, and openings or apertures may partially or fully extend through the coating on the top side 29.

In the configuration of the reflector plate assembly 25 shown with the coating 35 on the backside 35 of the reflector plate 28, the rate of wafer byproduct deposition on the reflector plate 28 is decreased, thus extending what may be referred to as the Mean Wafer Between Clean (MWBC). The MWBC refers to the mean number of wafers processed before cleaning must be performed on the reflector plate 28 to reduce or remove byproduct deposition the on the reflector plate 28. The optically transparent reflector plate 28 stays hotter with the reflective coating facing the baseplate surface (i.e. the backside 37 or second surface) because light must past through the optically transparent reflector plate body to the reflective coating and then back through the optically transparent reflector plate body on its way out. The amount of heat that is retained during this operation can be tuned with dopants (such as rare earth elements) or with higher OH concentrations in the reflective coating 35. If the optically transparent reflector plate 28 has a higher OH content, it will absorb more radiated energy.

In an alternative embodiment, the body of the reflector plate 28 is made from a non-transparent ceramic. In this embodiment, if the reflective coating 35 is placed on the top side 29 of the reflector plate 28, the light would be reflected off the coating. This may aid in helping to allow the reflector plate 28 to remain cooler by avoiding uneven heating the wafer early in the heating process. A ceramic such as quartz or sapphire has a low coefficient of thermal expansion over a large temperature range (for example in the range of about 22° C. to about 800° C.). Accordingly, reflective coatings can be more easily applied compared to aluminum reflector plates. The coatings tend to adhere more readily to ceramic materials such as quartz than to aluminum or stainless steel. According to one or more embodiments, the reflective coating has a maximum operating temperatures around 400° C. (compared to about 200° C. for a reflective coating on an aluminum reflector plate). Again, because of the higher operating temperature capability, wafer byproduct deposition can be reduced or nearly eliminated.

The reflective coating 35 can be any variety of materials. Processes and providers of services to provide windows with thin layers of reflective layer for reflection in specified range of wavelengths are known. One provider of such coating services is for instance JDS Uniphase. Materials that can be used in a reflective coating 35 may be alternating layers of, in general, any combination of high index and low index dielectric materials which are substantially transparent to most of the radiation emitted from the heating source, such as titania-silica or tantala-silica. In one embodiment, the reflective layer is made up of $SiO_2$ and $Ta_2O_5$ layers. In another embodiment, the reflective layer is made up of $SiO_2$ and $TiO_2$. In a specific embodiment, the outermost layer comprises $SiO_2$.

In one embodiment, the layers may include multiple (thin) layers of optically transparent materials with different refractive indices, which are sometimes referred to as dielectric mirrors. A multilayer dielectric mirror may work as a reflective filter, wherein radiation is reflected. Radiation may be reflected selectively dependent among other elements on the wavelength of the radiation, the angle of incidence of the radiation, properties of the applied dielectric material including the refractive index of the applied dielectric material, the thickness of each layer, the number of layers a different thickness, and arrangement of layers.

Reference throughout this specification to "one embodiment," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. For example, while the present invention has been described with respect to a particular type of heating lamp, other variants are possible. Thus, it is intended that the present invention include modifications and variations that are within the scope of the appended claims and their equivalents.

What is claimed is:

1. An apparatus for processing a substrate having a front side and a back side, the apparatus comprising:
    a processing chamber having a process area defined on one side by a window adjacent a radiant heat source located outside the process area;
    a reflector plate assembly comprising a baseplate and a reflector plate, the baseplate disposed opposite the radiant heat source, the reflector plate disposed between the baseplate and the radiant heat source and spaced a distance from the baseplate, the reflector plate comprising a body having a first surface closest to the radiant heat source and a second surface closer to the baseplate, the body made from an optically transparent ceramic material and having a reflective coating comprising a plurality of dielectric layers on the second surface, the reflective coating including a plurality of pyrometer apertures extending therethrough, the plurality of pyrometer apertures in the reflective coating do not extend through the first surface of the body;
    the optically transparent ceramic material including a dopant to increase the amount of heat absorbed by the reflector plate; and
    at least one pyrometer probe positioned adjacent at least one of the pyrometer apertures in the reflective coating.

2. The apparatus of claim 1, wherein the optically transparent ceramic material is selected from alumina, silicon carbide, quartz, and sapphire.

3. The apparatus of claim 1, wherein the apertures extend only through the reflective coating.

4. The apparatus of claim 1, wherein the reflector plate and baseplate are spaced apart by less than about 5 mm.

5. The apparatus of claim 1, wherein the reflector plate assembly includes standoffs to separate the reflector plate and baseplate in a spaced apart relationship.

6. The apparatus of claim 1, wherein the dopant is selected from rare earth materials, OH and combinations thereof.

7. The apparatus of claim 1, wherein the baseplate includes a plurality of openings aligned with the apertures in the reflector plate.

8. A reflector plate assembly apparatus for use in a rapid thermal processing chamber comprising:
    a baseplate having a plurality of openings therethrough to accommodate a pyrometer probe; and
    a reflector plate comprising a body made from an optically transparent ceramic material, the optically transparent ceramic material including a dopant to increase the amount of heat absorbed by the reflector plate, the body having a first surface and a second surface facing the baseplate, the second surface having a reflective coating comprising a plurality of dielectric layers thereon, and a plurality of pyrometer apertures extending through at least the reflective coating, each pyrometer aperture aligned with an opening in the baseplate,
    wherein the pyrometer apertures do not extend through the first surface of the body and the reflective coating has an operating temperature up to about 400° C. and resists peeling in a rapid thermal processing chamber heated at a rate greater than or equal to about 50° C./sec.

9. The apparatus of claim 8, wherein the baseplate includes a plurality of standoffs to maintain the reflector plate and baseplate in a spaced apart relationship.

10. The apparatus of claim 8, wherein the ceramic material is selected from alumina, silicon carbide, quartz, and sapphire.

11. The apparatus of claim 8, wherein the dopant is selected from rare earth materials, OH, and combinations thereof.

* * * * *